US006997547B2

(12) United States Patent
Junhua

(10) Patent No.: US 6,997,547 B2
(45) Date of Patent: Feb. 14, 2006

(54) PIEZOELECTRIC ELEMENT, PIEZOELECTRIC ACTUATOR AND LIQUID JETTING HEAD INCORPORATING THE SAME

(75) Inventor: Chang Junhua, Nagano (JP)

(73) Assignee: Seiko Epson Corporation, Tokyo (JP)

(*) Notice: Subject to any disclaimer, the term of this patent is extended or adjusted under 35 U.S.C. 154(b) by 72 days.

(21) Appl. No.: 10/390,155

(22) Filed: Mar. 18, 2003

(65) Prior Publication Data

US 2004/0100536 A1 May 27, 2004

(30) Foreign Application Priority Data

| | | |
|---|---|---|
| Mar. 18, 2002 | (JP) | P2002-075088 |
| Jun. 5, 2002 | (JP) | P2002-164690 |
| Mar. 14, 2003 | (JP) | P2003-070546 |

(51) Int. Cl.
*B41J 2/045* (2006.01)

(52) U.S. Cl. .......................... 347/72; 347/71; 310/311

(58) Field of Classification Search .................. 347/68, 347/71, 72, 69, 70, 73; 310/311, 324, 328, 310/330, 331, 346

See application file for complete search history.

(56) References Cited

U.S. PATENT DOCUMENTS

| | | | |
|---|---|---|---|
| 5,889,353 A * | 3/1999 | Takeuchi et al. | 310/330 |
| 5,933,167 A * | 8/1999 | Shimada et al. | 347/70 |
| 6,341,850 B1 * | 1/2002 | Sakai | 347/70 |
| 6,447,106 B1 * | 9/2002 | Watanabe et al. | 347/70 |
| 6,504,287 B1 | 1/2003 | Yun et al. | |
| 6,557,986 B1 * | 5/2003 | Watanabe et al. | 347/70 |
| 6,584,660 B1 * | 7/2003 | Shimogawa et al. | 29/25.35 |
| 2002/0011986 A1 * | 1/2002 | Hasegawa et al. | 345/108 |
| 2002/0149651 A1 * | 10/2002 | Moriya et al. | 347/68 |

FOREIGN PATENT DOCUMENTS

| | | |
|---|---|---|
| JP | 02-289352 | 11/1990 |
| JP | 03/128681 | 5/1991 |
| JP | 3-285374 A | 12/1991 |
| JP | 09/277531 | 10/1997 |
| JP | 09-323410 | 12/1997 |
| JP | 10-034924 | 2/1998 |
| JP | 11-005305 | 1/1999 |
| JP | 2000-077438 | 3/2000 |
| JP | 2000-141647 | 5/2000 |
| JP | 2000-332313 | 11/2000 |
| JP | 2001-077438 | 3/2001 |
| WO | WO 02/073710 A1 | 9/2002 |

* cited by examiner

*Primary Examiner*—Manish Shah
*Assistant Examiner*—Leonard Liang
(74) *Attorney, Agent, or Firm*—Sughrue Mion, PLLC

(57) ABSTRACT

A first piezoelectric layer is laminated on a first common electrode and comprised of a first piezoelectric material having a first residual stress. A drive electrode is laminated on the first piezoelectric layer, to which a drive signal is supplied externally. A second piezoelectric layer is laminated on the drive electrode and comprised of a second piezoelectric material having a second residual stress lower than the first residual stress. A second common electrode is laminated on the second piezoelectric layer.

6 Claims, 4 Drawing Sheets

PIEZOELECTRIC ELEMENT, PIEZOELECTRIC ACTUATOR AND LIQUID JETTING HEAD INCORPORATING THE SAME

BACKGROUND OF THE INVENTION

The invention relates to a piezoelectric element which becomes deformed upon receipt of a supplied drive signal, to a piezoelectric actuator and a liquid ejecting head using such a piezoelectric element as a drive source.

A piezoelectric element is formed from piezoelectric ceramics or a piezoelectric macromolecular film utilizing a high molecular compound and becomes deformed upon receipt of supplied electric energy, wherein the piezoelectric ceramics is formed by compressing and sintering metal oxide powder, such as $BaTiO_3$, $PbZrO_3$, $PbTiO_3$, which are piezoelectric materials and exhibit a piezoelectric effect. The piezoelectric element is in widespread use as a drive element for, e.g., a liquid ejecting head, a micropump, and a sounding body (a speaker or the like). Here, the liquid ejecting head ejects a droplet from a nozzle orifice. The liquid ejecting head is embodied as, e.g., a recording head to be used in an image recording apparatus such as a printer, a liquid-crystal ejecting head for use in manufacturing a liquid-crystal display, and a coloring material ejecting head to be used for manufacturing a color filter. Here, the micropump is an ultrasmall pump capable of ejecting a very small volume of liquid and used at the time of, e.g., delivery of a trace amount of chemical.

In the field of such a piezoelectric element, strong demand exists for high-frequency driving of the piezoelectric element, and an increase in the rigidity of the piezoelectric element is sought. In the case of the recording head, the piezoelectric element is driven at a high frequency of about 10 to 30 kHz. In order to improve the durability of the piezoelectric element under such a driving condition, the rigidity of the piezoelectric element must be increased. Here, the only requirement for increasing the rigidity of the piezoelectric element is to increase the thickness of the piezoelectric layer. In this case, in order to ensure achievement of sufficient rigidity, a drive voltage must be increased, which is not suitable for high-frequency driving.

A piezoelectric element of multilayer structure is proposed as a piezoelectric element which achieves required rigidity and can be driven at substantially the same drive voltage as that conventionally employed. For instance, Japanese Patent Publication No. 2-289352A discloses a piezoelectric element which is formed from a piezoelectric layer having a two-layer structure; that is, an upper layer piezoelectric substance and a lower layer piezoelectric substance. Drive electrodes (individual electrodes) are formed at a boundary between the upper layer piezoelectric substance and the lower layer piezoelectric substance. A common electrode is formed on an outer surface of the upper layer piezoelectric substance, and another common electrode is formed on an outer surface of the lower layer piezoelectric substance. Similarly, Japanese Patent Publication No. 10-34924A also discloses a piezoelectric element of multilayer structure.

In the case of the piezoelectric element of multilayer structure, the drive electrodes are provided at the boundary between the upper layer piezoelectric substance and the lower layer piezoelectric substance. Hence, an electric field, whose intensity is determined by an interval between the drive electrodes and the common electrodes (i.e., the thickness of each piezoelectric substance) and by a potential difference between the drive electrodes and the common electrodes, is imparted to the piezoelectric substances of respective layers. Therefore, in contrast with a piezoelectric element of monolayer structure formed by interposing a single-layer piezoelectric substance between the common electrode and the drive electrodes, the piezoelectric element can be deformed greatly at the same drive voltage as that conventionally required, even when the rigidity of the piezoelectric element is increased by increasing the overall thickness of the piezoelectric element to some extent.

However, mere use of the piezoelectric element of multilayer structure cannot achieve performances that meet recently-growing demand. Therefore, users are forced to use, as an actual product, a piezoelectric element of monolayer structure formed by interposing a single layer piezoelectric substance between a common electrode and drive electrodes.

SUMMARY OF THE INVENTION

The present invention has been conceived in view of the foregoing circumstances and aims at improving the efficiency of deformation of a piezoelectric element of multilayer structure.

In order to achieve the above object, according to the invention, there is provided a piezoelectric element, comprising:

a first common electrode;

a first piezoelectric layer, laminated on the first common electrode and comprised of a first piezoelectric material having a first residual stress;

a drive electrode, laminated on the first piezoelectric layer, to which a drive signal is supplied externally;

a second piezoelectric layer, laminated on the drive electrode and comprised of a second piezoelectric material having a second residual stress lower than the first residual stress; and a second common electrode, laminated on the second piezoelectric layer.

Preferably, a thickness of a peripheral edge portion of the second piezoelectric layer is reduced.

Preferably, the first piezoelectric material has a first contraction coefficient at a baking temperature, and the second piezoelectric material has a second contraction coefficient at the baking temperature, which is lower than the first contraction coefficient.

Preferably, the first piezoelectric material has a first piezoelectric coefficient, and the second piezoelectric material has a second piezoelectric coefficient larger than the first piezoelectric coefficient.

According to the invention, there is also provided a piezoelectric actuator comprising a vibration plate to be deformed by the above piezoelectric element.

According to the invention, there is also provided a liquid ejecting head, comprising the above actuator such that a portion of the vibration plate deformed by the piezoelectric element constitutes a part of a pressure chamber communicated with a nozzle orifice from which a liquid droplet is ejected.

According to the above configurations, the degree to which the first common electrode is deformed by an electric field developing between the drive electrodes and the common electrodes as a result of supply of a drive signal can be increased. As a result, a deformed object, such as a vibration plate, can be deformed efficiently.

DETAILED DESCRIPTION OF THE PREFERRED EMBODIMENTS

Figure 1:
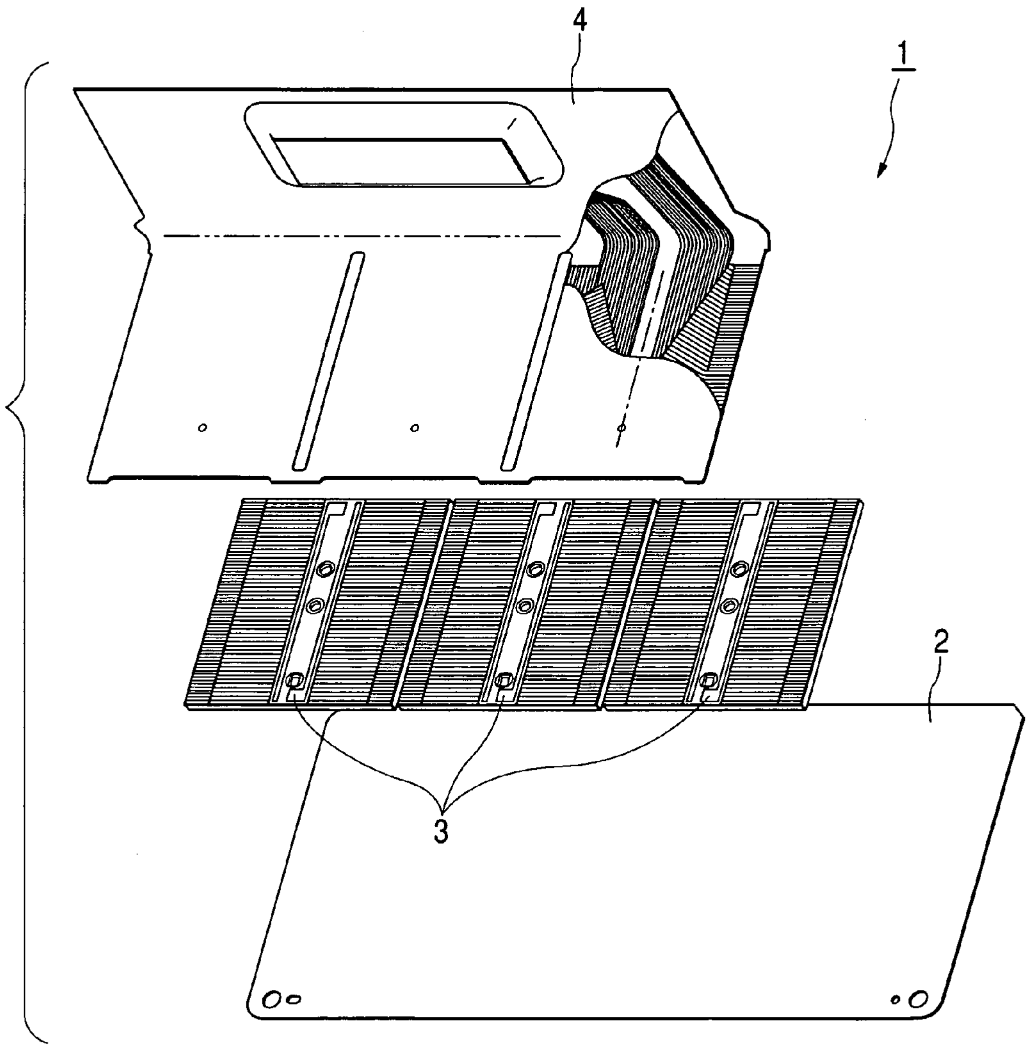
FIG. 1 is an exploded perspective view showing the configuration of a recording head.

Embodiments of the invention will be described hereinbelow by reference to the accompanying drawings. Here, the embodiments will be described by taking, as an example, a recording head (a kind of liquid ejecting head) using a piezoelectric element. As shown in FIG. 1, a recording head 1 is essentially formed from a flow passage unit 2, a plurality of actuator units 3, and a film-shaped wiring board 4. The actuator units 3 are bonded side by side on the surface of the flow passage unit 2, and the wiring board 4 is attached to the surface of the actuator unit 3 opposite the flow passage unit 2.

Figure 2:
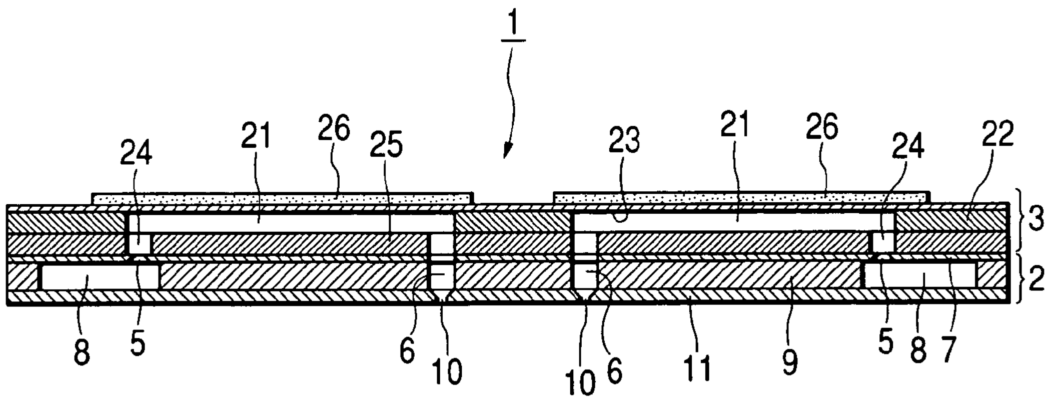
FIG. 2 is a cross-sectional view showing an actuator unit and a flow passage unit.

As shown in FIG. 2, the flow passage unit 2 is fabricated from a supply port formation substrate 7 having formed therein through holes which are to serve as ink supply ports 5, and through holes which are to constitute portions of nozzle communication ports 6; an reservoir formation substrate 9 having formed therein through holes which are to serve as a common ink reservoir 8, and through holes which are to constitute portions of the nozzle communication ports 6; and a nozzle plate 11 having formed therein nozzle orifices 10 oriented in a secondary scanning direction (i.e., a direction orthogonal to a primary scanning direction in which the recording head 1 is to move). The supply port formation substrate 7, the reservoir formation substrate 9, and the nozzle plate 11 are formed by pressing, for example, a stainless steel plate.

The flow passage unit 2 is fabricated by placing the nozzle plate 11 on one surface of the reservoir formation substrate 9 (e.g., a lower side in the drawing) and the supply port formation substrate 7 on the other surface of the same (e.g., an upper side in the drawing), and bonding together the supply port formation substrate 7, the reservoir formation substrate 9, and the nozzle plate 11. For instance, the flow passage unit 2 is fabricated by bonding together the members 7, 9, and 11 by use of, e.g., a sheet-like adhesive.

Figure 3:
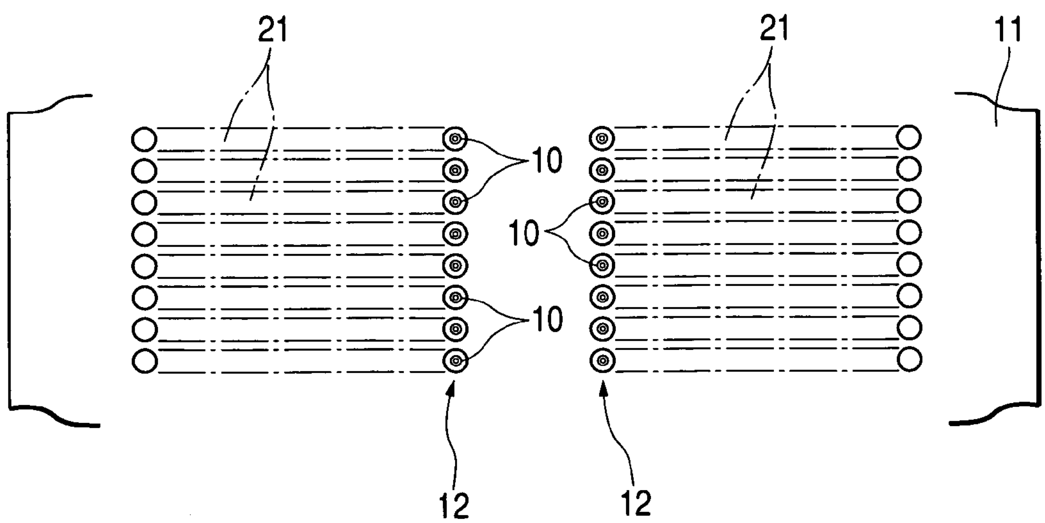
FIG. 3 is an enlarged partial plan view showing a nozzle plate.

As shown in FIG. 3, the nozzle orifices 10 are formed in a plurality of rows at predetermined pitches. Rows of nozzles 12 are formed from the plurality of nozzle orifices 10 arranged in rows. For example, a row of nozzles 12 is formed from 92 nozzle orifices 10. Two rows of nozzles 12 are formed for one actuator unit 3. Since the recording head 1 of the embodiment has three actuator units 3, a total of six rows of nozzles 12 are formed side by side for one flow passage unit 2.

The actuator unit 3 is a member also called a head chip. The actuator unit 3 comprises a pressure chamber formation substrate 22 having formed therein through holes which are to constitute pressure chambers 21; a vibration plate 23 for partitioning a part of the pressure chamber 21; a cover member 25 having formed therein through holes which are to constitute portions of supply-side communication ports 24 and through holes which are to constitute portions of the nozzle communication ports 6; and a piezoelectric element 26 serving as a drive source. With regard to the thicknesses of the members 22, 23, and 25, the pressure chamber formation substrate 22 and the cover member 25 preferably assume a thickness of 50 $\mu$m or more, more preferably 100 $\mu$m or more. The vibration plate 23 preferably assumes a thickness of 50 $\mu$m or less, more preferably 3 to 12 $\mu$m or thereabouts. The vibration plate 23 of the embodiment is formed so as to assume a thickness of about 6 $\mu$m.

In the actuator unit 3, the vibration plate 23 and the piezoelectric element 26 constitute a piezoelectric actuator of the invention. The vibration plate 23 is a kind of support member on which the piezoelectric element 26 is to be provided.

The actuator unit 3 is formed from a ceramic sheet in which constituent elements (e.g., the pressure chambers 21 and the piezoelectric elements 26) equal in number to a plurality of units are formed. For example, ceramic slurry is prepared from ceramic material, such as alumina or zirconia; a binder; and a liquid medium, or the like. Next, a green sheet (i.e., a sheet material which is not yet sintered) is formed from the slurry through use of a common apparatus such as a doctor blade apparatus or a reverse roll coater. Subsequently, the green sheet is subjected to processing, such as cutting or punching, thereby forming required through holes. Thus, sheet-like precursors for the pressure chamber formation substrate 22, the vibration plate 23, and the cover member 25 are formed.

A precursor for the cover member 25 is placed on one surface of a precursor for the pressure chamber formation substrate 22, and a precursor for the vibration plate 23 is placed on the other surface of the pressure chamber formation substrate 22. Then, the precursors are sintered, whereby the precursors are integrated into a single sheet-like member. The piezoelectric elements 26 or the like are formed in the thus-sintered sheet-like member, thereby forming a ceramic sheet. In this case, the sheet-like precursors and the piezoelectric elements 26 are integrated together by sintering, and hence special bonding operation is not necessary. Moreover, a high sealing characteristic can be achieved at bonded surfaces of the respective bonded surfaces.

When the ceramic sheet has been formed, a plurality of actuator units 3 are formed by slicing the ceramic sheet.

The pressure chamber 21 is a hollow section which is elongated in the direction orthogonal to the row of nozzles 12, and, as shown in FIG. 3, a plurality of pressure chambers 21 are formed so as to correspond to the nozzle orifices 10. Specifically, the pressure chambers 21 are arranged in rows in line with the row of nozzles. One end of each pressure chamber 21 is in communication with the corresponding nozzle orifice 10 by way of the nozzle communication port 6. The other end on the side of the pressure chamber 21 opposite the nozzle communication port 6 is in communication with the common ink reservoir 8 by way of the supply-side communication port 24 and the ink supply port 5. A part of the pressure chamber 21 is partitioned by the vibration plate 23.

Here, the piezoelectric element 26 is a piezoelectric element of so-called flexural vibration mode and is provided, for each pressure chamber 21, on the surface of the vibration plate 23 opposite the pressure chamber 21. The width W of the piezoelectric element 26 (see FIG. 5) is substantially identical with the width (inner dimension) of the pressure chamber 21, and the piezoelectric element 26 is somewhat greater in length than the pressure chamber 21. More specifically, the piezoelectric element 26 is arranged such that both ends of the piezoelectric element 26 extend beyond the corresponding longitudinal ends of the pressure chamber 21.

Figures 4A, 4B:
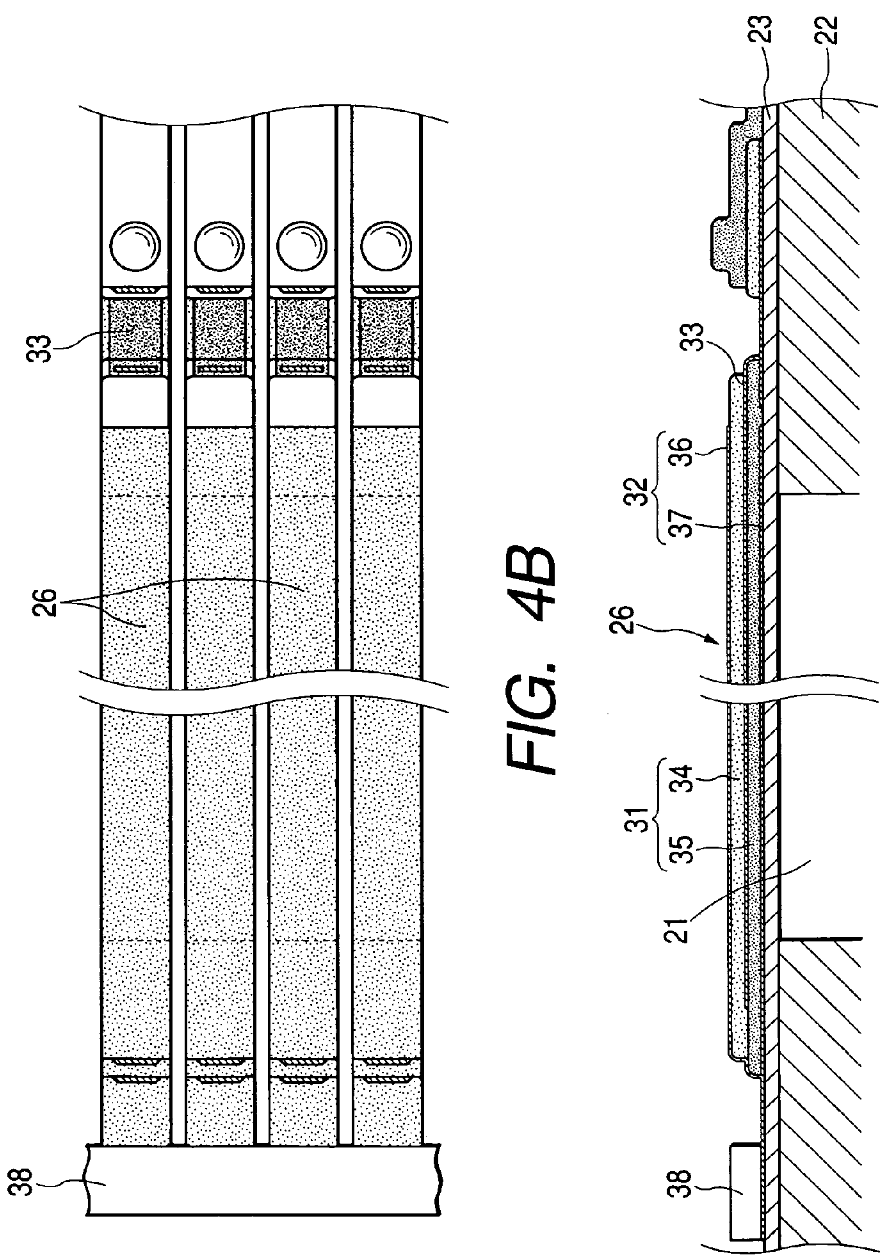
FIG. 4A is a plan view of a piezoelectric element.
FIG. 4B is a cross-sectional view of the piezoelectric element taken along a longitudinal direction thereof.
Figure 5:
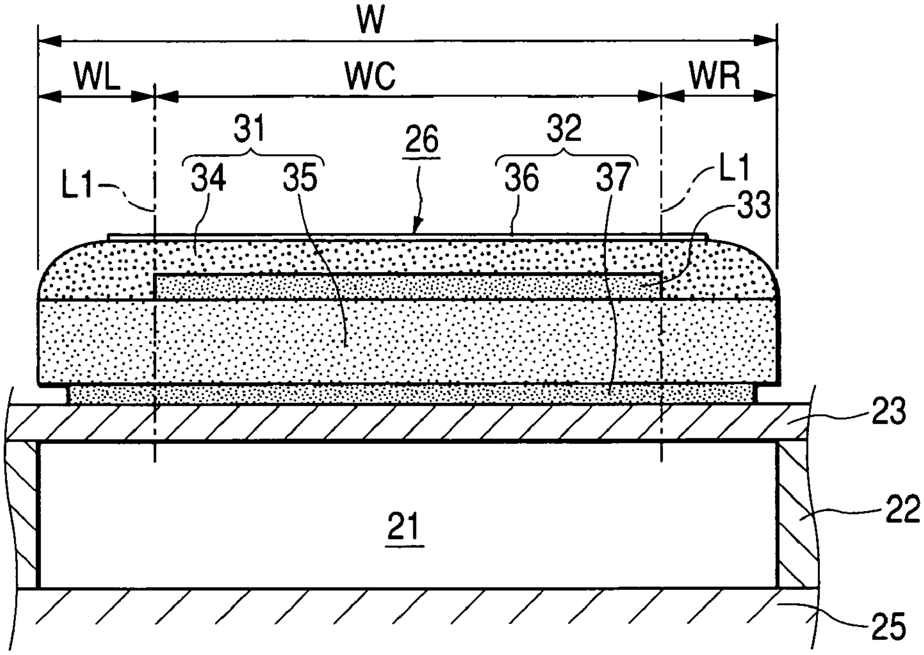
FIG. 5 is a cross-sectional view of the piezoelectric element taken along a transverse direction thereof.

For instance, as shown in FIGS. 4A, 4B, and 5, the piezoelectric element 26 is formed from a piezoelectric layer 31, a common prong electrode 32, a drive electrode 33, and the like. The piezoelectric layer 31 is sandwiched between the drive electrode 33 and the common prong electrode 32. The structure of the piezoelectric element 26 will be described in detail later.

A drive signal supply source (not shown) is electrically connected to the drive electrode 33. The common electrode 32 is controlled to, e.g., a ground potential. When a drive signal is supplied to the drive electrode 33, an electric field whose intensity is related to a potential difference between the drive electrode 33 and the common electrode 32 is generated. Since the electric field is imparted to the piezoelectric layer 31, the piezoelectric layer 31 becomes deformed in accordance with the intensity of the imparted electric field.

Figure 6:
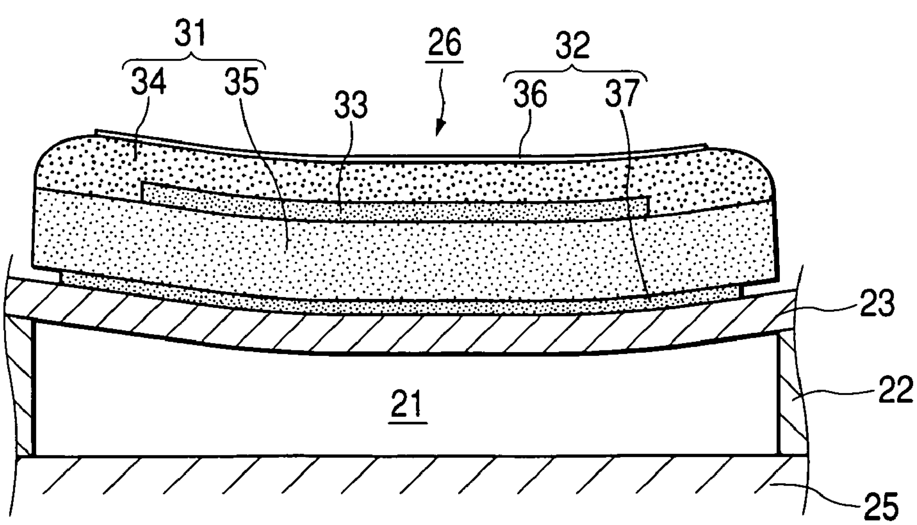
FIG. 6 is a cross-sectional view showing a deformed state of the piezoelectric element (i.e., a contracted state of the pressure chamber).

More specifically, as the electric potential of the drive electrode 33 increases, the piezoelectric layer 31 contracts in the direction orthogonal to the electric field, thereby deforming the vibration plate 23 such that the volume of the pressure chamber 21 is reduced (e.g., a state shown in FIG. 6). As the electric potential of the drive electrode 33 is reduced, the piezoelectric layer 31 expands in the direction orthogonal to the electric field, thereby deforming the vibration plate 23 such that the volume of the pressure chamber 21 is increased.

The actuator unit 3 and the flow passage unit 2 are bonded together. For instance, a sheet-like adhesive is interposed between the supply port formation substrate 7 and the cover member 25. In this state, pressure is applied to the actuator unit 3 toward the flow passage unit 2, whereupon the actuator unit 3 and the flow passage unit 2 are bonded together.

In the recording head 1 having such a construction, an ink flow passages are formed, for each nozzle orifice, 10, so as to extend from the common ink reservoir 8 to the nozzle orifice 10 by way of the ink supply port 5, the supply-side communication port 24, the pressure chamber 21, and the nozzle communication port 16. When the actuator unit is in use, the inside of the ink flow passage is filled with ink. As a result of the piezoelectric element 26 having become deformed, a corresponding pressure chamber 21 is subjected to contraction or expansion, thereby causing pressure fluctuations in the ink stored in the pressure chamber 21. By controlling the ink pressure, the nozzle orifice 10 can be caused to eject an ink droplet. For instance, if the pressure chamber 21 having a stationary volume is subjected to rapid contraction once having been expanded, the pressure chamber 21 is filled with ink in association with expansion of the pressure chamber 21. By subsequent rapid contraction, the ink stored in the pressure chamber 12 is pressurized, whereupon an ink droplet is ejected.

Here, high-speed recording operation involves a necessity for ejecting a larger number of ink droplets within a short time period. In order to satisfy this requirement, the rigidity of the piezoelectric element 26 and the drive voltage must be taken into consideration. More specifically, in order to cause the piezoelectric element to withstand actuation at a frequency higher than a conventional frequency, the rigidity of the piezoelectric element must be increased so as to become greater than that of a related-art piezoelectric element. At the time of implementation of high-frequency driving, an increase in the drive voltage is not preferable.

For these reasons, the embodiment employs the piezoelectric element 26 of multilayer structure. The following description explains this point.

First, the structure of the piezoelectric element 26 is described in detail by reference to FIGS. 4A, 4B, and 5. The piezoelectric layer 31 is formed into a block which is elongated in the longitudinal direction of the pressure chamber. The piezoelectric layer 31 is formed from an upper layer piezoelectric substance (i.e., an outer piezoelectric substance) 34 and a lower layer piezoelectric substance (i.e., an inner piezoelectric substance) 35. The common prong electrode 32 is formed from an upper common electrode (i.e., a common outer electrode) 36 and a lower common electrode (i.e., a common inner electrode) 37. The electrodes 36, 37 and the drive electrodes 33 constitute electrode layers.

Here, the terms "upper (or outer)" and "lower (or inner)" denote a positional relationship with reference to the vibration plate 23 (a kind of support member). The term "upper (outer)" denotes the surface of the piezoelectric element distant from the vibration plate 23, and the term "lower (inner)" denotes the surface of the same close to the vibration plate 23.

The drive electrode 33 serves as an individual electrode and is formed at a boundary between the upper layer piezoelectric substance 34 and the lower layer piezoelectric substance 35. The upper common electrode 36 and the lower common electrode 37 constitute common electrodes in conjunction with a common trunk electrode 38. The common electrodes are formed into a pectinated pattern, wherein a plurality of common prong electrodes 32 (i.e., the upper common electrodes 36 and the lower common electrodes 37) are formed so as to extend from the common trunk electrode 38.

The lower common electrode 37 is formed below the lower layer piezoelectric substance 35; that is, on the surface of the lower layer piezoelectric substance opposite the drive electrode 33. The upper common electrode 36 is formed on the upper layer piezoelectric substance 34; that is, on the surface of the upper layer piezoelectric substance 34 opposite the drive electrode 33. Specifically, the piezoelectric element 26 has a multilayer structure comprising, in order from the vibration plate, the lower common electrode 37, the lower layer piezoelectric substance 35, the drive electrode 33, the upper layer piezoelectric substance 34, and the upper common electrode 36. The piezoelectric element 26 covers the lower common electrode 37 while extending beyond the overall width thereof by intervention of the lower layer piezoelectric substance 35. The piezoelectric element 26 covers the drive electrode 33 while extending beyond the overall width thereof by intervention of the upper layer piezoelectric substance 34. Accordingly, the drive electrode 33 is embedded, in the transverse direction thereof, within the upper and lower piezoelectric layers 34, 35.

The thickness of the piezoelectric layer 31 obtained at substantially the center with respect to the transverse direction thereof is equal to a total thickness of the upper layer piezoelectric substance 34 and the lower layer piezoelectric substance 35; that is, about 17 $\mu$m. The lower common electrode 37 has a thickness of about 3 $\mu$m, and the upper common electrode 36 has a thickness of about 0.3 $\mu$m. Therefore, the total thickness of the piezoelectric element 26, including the common electrode 32, is about 20 $\mu$m.

The total thickness of the conventional piezoelectric element 26 of monolayer structure is about 15 μm. Accordingly, as the thickness of the piezoelectric element 26 is increased, the rigidity of a deformed portion of the pressure chamber 21 (i.e., the entire assembly consisting of the vibration plate 23 and the piezoelectric element 26) becomes increased correspondingly.

As mentioned above, the length of the piezoelectric element 26 is greater than the longitudinal length of the pressure chamber 21. Both longitudinal ends of the piezoelectric element 26 are formed so as to extend beyond the corresponding ends of the pressure chamber 21. The width W of the piezoelectric element 26 is made equal to the width of the pressure chamber 21. Accordingly, the respective piezoelectric elements 26 can also be described as being formed so as to cover the pressure chamber 21 in the longitudinal direction thereof.

The upper common electrode 36 and the lower common electrode 37 are controlled to a given potential, e.g., a ground potential, regardless of the drive signal. The drive electrode 33 varies in potential in accordance with a supplied drive signal. Accordingly, supply of the drive signal induces an electric field between the drive electrode 33 and the upper common electrode 36 and between the drive electrode 33 and the lower common electrode 37, wherein the electric fields are opposite in direction to each other.

Various conductors; e.g., a single metal substance, a metal alloy, or a mixture consisting of electrically insulating ceramics and metal, are selected as materials which constitute the electrodes 33, 36, and 37. The materials are required not to cause any deterioration at a sintering temperature. In the embodiment, gold is used for the upper common electrode 36, and platinum is used for the lower common electrode 37 and the drive electrode 33.

The upper layer piezoelectric substance 34 and the lower layer piezoelectric substance 35 are formed from piezoelectric material containing, e.g., lead zirconate titanate (PZT) as the main ingredient. The direction of polarization of the upper layer piezoelectric substance 34 is opposite that of the lower layer piezoelectric substance 35. Therefore, when the drive signal is applied to the upper layer piezoelectric substance 34 and the lower layer piezoelectric substance 35, the substances expand and contract in the same direction and can become deformed without any problem. The upper layer piezoelectric substance 34 and the lower layer piezoelectric substance 35 deform the vibration plate 23 such that the volume of the pressure chamber 21 is reduced with an increase in the potential of the drive electrode 33 and such that the volume of the pressure chamber 21 is increased with a decrease in the potential of the drive electrode 33.

In the embodiment, in order to efficiently deform the piezoelectric element 26; i.e., in order to increase the deformation amount of the piezoelectric element in response to an applied voltage, the upper layer piezoelectric substance 34 is formed from a piezoelectric material which achieves a contraction rate smaller than that achieved by the lower layer piezoelectric substance 35 during sintering operation. Thus, residual stress exerted on the upper layer piezoelectric substance 34 after sintering is made smaller than that exerted on the lower layer piezoelectric substance 35.

In this way, in a case where the residual stress exerted on the upper layer piezoelectric substance 34 after sintering is made smaller than that exerted on the lower layer piezoelectric substance 35, the upper layer piezoelectric substance 34 can be made more easily deformable than the lower piezoelectric substance 35 at the time of supply of a drive signal. Namely, the upper layer piezoelectric substance 34 can be deflected to a greater extent than the lower piezoelectric substance 35. When the upper layer piezoelectric substance 34 has become deflected to a greater extent than the lower layer piezoelectric substance 35, the upper layer piezoelectric substance 34 is spaced farther from the vibration plate 23 than is the lower layer piezoelectric substance 35, and hence deformation of the upper layer piezoelectric 34 acts on the vibration plate 23 while the amount of deformation is amplified. Thus, the amount of deformation of the vibration plate 23 can be increased.

For instance, the piezoelectric element 26 is compared with a comparative piezoelectric element, wherein the piezoelectric elements are equal in terms of the thickness of the upper layer piezoelectric substance 34 stacked on the lower layer piezoelectric substance 35 (i.e., the thickness of the piezoelectric element 26), width, and length; and wherein the upper layer piezoelectric substance 34 of the comparative piezoelectric element is greater in thickness than the lower layer piezoelectric substance 35. In the case of the piezoelectric element 26 of the embodiment, the upper layer piezoelectric substance 34 involving a relatively greater amount of deflection is located distant from the vibration plate 23. In the case of the comparative piezoelectric element, the lower layer piezoelectric substance 35 involving a relatively large amount of deformation is located in close proximity to the vibration plate 23. The greater the distance between vibration plate 23 and the piezoelectric layer involving a larger amount of deformation, the greater the extent to which the vibration plate 23 can be deformed. Therefore, the piezoelectric element 26 of the embodiment can deform the vibration plate 23 to a greater extent than does the comparative piezoelectric element. Since the comparative piezoelectric element is identical with the piezoelectric element 26 in terms of height, width, and length, the piezoelectric element 26 of the embodiment and the comparative piezoelectric element have the same electrostatic capacitance.

Since the vibration plate 23 can be deformed greatly, the volume of the pressure chamber 21, which would be achieved at the time of contraction of the piezoelectric element shown in FIG. 6, can be made smaller. Accordingly, a volumetric difference between the expanded pressure chamber 21 and the contracted pressure chamber 21 can be made greater than that achieved when the piezoelectric element 26 of multilayer structure is simply used, thereby increasing the quantity of ink droplet to be ejected.

Various materials which differ from each other in terms of heat contraction rate are conceivable. For instance, in the case of lead zirconate titanate [$Pb(Zr_xTi_{1-x})O_3$], which is one type of piezoelectric material, the heat contraction rate of the piezoelectric can be changed by changing the additive proportions between Zr and Ti. For instance, when a piezoelectric material to which Zr and Ti are added in proportions of 22:78 is compared with a piezoelectric material to which Zr and Ti are added in proportions of 40:60, the piezoelectric material with additive proportions of 22:78 has a greater heat contraction rate.

The heat contraction rate also changes according to a sintering temperature. Accordingly, lead zirconate titanate which is given a desired heat contraction rate by controlling the additive proportions and the sintering temperature is used for the upper layer piezoelectric substance 34, thereby controlling residual stress.

The heat contraction rate changes from one piezoelectric material to another. Therefore, a similar effect can also be achieved by use, for the upper layer piezoelectric substance 34 and the lower piezoelectric substance 35, of different piezoelectric materials which achieve desired heat contraction rates. For instance, piezoelectric materials other than lead zirconate titanate include lead niobate magnesium, lead niobate nickel, lead niobate manganese, lead stannate antimony, lead niobate zinc, and lead titanate. Two arbitrary types of piezoelectric materials may be selected from these materials, and the upper and lower layer piezoelectric substances 34, 35 may be formed from the thus-selected piezoelectric materials.

Even in a case where the piezoelectric materials are the same, their heat contraction rates may differ from each other according to a content of a binder in a slurry. Since the binder is eliminated from the piezoelectric material through sintering, the heat contraction rate of the piezoelectric material becomes greater with an increase in the content of a binder. Accordingly, the content of a binder in a slurry used for making the upper layer piezoelectric substance 34 is made lower than that of a binder in a slurry used for making the lower layer piezoelectric substance 35. As a result, the upper layer piezoelectric substance 34 can be made lower in heat contraction rate than the lower layer piezoelectric substance 35. Consequently, the upper layer piezoelectric substance 34 can be made lower than the lower layer piezoelectric substance 35 in terms of residual stress stemming from sintering.

From the same viewpoint, the upper layer piezoelectric substance 34 may be formed from a piezoelectric material which is greater in piezoelectric constant than the lower layer piezoelectric substance 35. When the piezoelectric element is formed in this way, the amount of deformation of the upper layer piezoelectric substance 34 can be made greater than that of the lower layer piezoelectric substance 35 even when the respective layer piezoelectric substances have the same thickness (i.e., when an electric field of the same intensity is imparted). Thus, a working-effect identical with that achieved in the embodiment can also be achieved. More specifically, since the upper layer piezoelectric substance 34 is spaced farther from the vibration plate 23 than is the lower layer piezoelectric substance 35, deformation of the upper layer piezoelectric 34 acts on the vibration plate 23 while the amount of deformation is amplified. Thus, the amount of deformation of the vibration plate 23 can be increased.

For example, the piezoelectric constant of lead zirconate titanate [$Pb(Zr_xTi_{1-x})O_3$] can be changed by changing the additive proportions of Zr and Ti. For example, when Zr and Ti are added to the lead zirconate titanate in proportions of 52:48, the resultant piezoelectric constant (d31) assumes a value of $93.5\times10^{-12}$. When Zr and Ti are added in proportions of 60:40, the resultant piezoelectric constant assumes a value of $44.2\times10^{-12}$. The piezoelectric constant also varies in accordance with a change in sintering environment, such as a change in temperature or humidity.

Two types of lead zirconate titanate, which have been prepared so as to assume a desired piezoelectric constant, are used for the upper layer piezoelectric substance 34 and the lower layer piezoelectric substance 35. As a result, the amount of deformation of the upper layer piezoelectric substance 34 can be made greater than that of the lower layer piezoelectric substance 35.

The piezoelectric constant changes according to a kind of piezoelectric material. For this reason, the piezoelectric substances 34, 35 may be formed from different piezoelectric materials.

In the embodiment, the upper layer piezoelectric substance 34 of the piezoelectric element 26 is laid such that a bulge appears in an upper side of a transverse cross-sectional profile of the upper layer piezoelectric substance 34. The following description explains this point.

FIG. 5 is a cross-sectional view of the piezoelectric element 26 in the transverse direction (i.e., the direction of a shorter side) of the electrode. A pair of first phantom lines L1, L1 are vertically extended from respective ends of the drive electrode 33 in the transverse direction thereof. In the piezoelectric element 26, the area defined by the first phantom lines L1, L1 is taken as a width center region WC. Areas located outside from the first phantom lines L1, L1 in the transverse direction are taken as end width regions WL, WR. More specifically, the area located left with reference to the center width region WC is taken as a left end width region WL, and the area located right with reference to the center width region WC is taken as a right end width region WR.

As shown in FIG. 5, the lower layer piezoelectric substance 35 is provided so as to cover the lower common electrode 37 in excess of the entire width thereof. The upper layer piezoelectric substance 34 is provided so as to cover the drive electrode 33 in excess of the entire width thereof. Therefore, the majority of the drive electrode 33 is embedded in the piezoelectric layers 34, 35. The lower layer piezoelectric substance 35 possessing an electrical insulation property is present between the drive electrode 33 and the lower common electrode 37, thereby reliably preventing occurrence of a short circuit between the drive electrode 33 and the lower common electrode 37.

In relation to the upper layer piezoelectric substance 34, the thickness of the end width regions WL, WR is gradually decreased toward the outside with respect to the transverse direction. The thickness of the end width regions WL, WR is made smaller than the thickness of the center width region WC. The upper layer piezoelectric substance 34 assumes an upwardly-bulging shape.

By such a configuration, the stress acting on the piezoelectric layers 34, 35 in the end width regions WL, WR becomes smaller than the stress exerted on the piezoelectric layers 34, 35 in the center width region WC. Therefore, the end width regions WL, WR become more easily deformable than the center width region WC, thereby enabling the piezoelectric element 26 to become efficiently deformed. Specifically, the quantity of energy required when the pressure chamber 21 shifts from an expanded state (i.e., the state shown in FIG. 5) to a contracted state (i.e., the state shown in FIG. 6) can be reduced.

The surface of the upper layer piezoelectric substance 34 has no steps and is smooth. Hence, the upper common electrode 36 can be formed uniformly. As a result, there can be prevented occurrence of failures; that is, a break in wiring of the upper common electrode 36 or partial non-deformation of the upper layer piezoelectric substance 34. Consequently, the reliability of the piezoelectric element 26 can be enhanced.

In relation to imparting of a difference in contraction rate between the upper layer dielectric substance 34 and the lower layer dielectric substance 35, the present embodiment has described a case where the additive proportions of elements (Zr, Ti), the combination of piezoelectric materials, and the content of a binder have been changed. However, the invention is not limited to these cases. For instance, the upper layer dielectric substance 34 can be made different in contraction rate from the lower layer dielectric substance 35 by changing, e.g., the particle size of piezoelectric material or an apparent density.

Thus far, the invention has been described by taking, as an example, the recording head 1 which is a kind of a liquid ejecting head. However, the invention can also be applied to other applications. For instance, the invention can also be applied to a micropump or a sounding body. For example, the invention can also be applied to a piezoelectric actuator comprising the piezoelectric element 26 provided on the vibration plate 23.

What is claimed is:

1. A piezoelectric element, comprising:
- a first common electrode;
- a first piezoelectric layer, laminated on the first common electrode and comprised of a first piezoelectric material having a first residual stress;
- a drive electrode, laminated on the first piezoelectric layer, to which a drive signal is supplied externally;
- a second piezoelectric layer, laminated on the drive electrode and comprised of a second piezoelectric material having a second residual stress lower than the first residual stress; and
- a second common electrode, laminated on the second piezoelectric layer.

2. The piezoelectric element as set forth in claim 1, wherein a thickness of a peripheral edge portion of the second piezoelectric layer is reduced.

3. The piezoelectric element as set forth in claim 1, wherein the first piezoelectric material has a first contraction coefficient at a baking temperature, and the second piezoelectric material has a second contraction coefficient at the baking temperature, which is lower than the first contraction coefficient.

4. The piezoelectric element as set forth in claim 1, wherein the first piezoelectric material has a first piezoelectric coefficient, and the second piezoelectric material has a second piezoelectric coefficient larger than the first piezoelectric coefficient.

5. A piezoelectric actuator comprising:
- a piezoelectric element further comprising:
  - a first common electrode;
  - a first piezoelectric layer, laminated on the first common electrode and comprised of a first piezoelectric material having a first residual stress;
  - a drive electrode, laminated on the first piezoelectric layer, to which a drive signal is supplied externally;
  - a second piezoelectric layer, laminated on the drive electrode and comprised of a second piezoelectric material having a second residual stress lower than the first residual stress; and
  - a second common electrode, laminated on the second piezoelectric layer; and
- a vibration plate, to be deformed by the piezoelectric element.

6. A liquid ejecting head, comprising:
- a piezoelectric actuator, having a piezoelectric element further comprising:
  - a first common electrode;
  - a first piezoelectric layer, laminated on the first common electrode and comprised of a first piezoelectric material having a first residual stress;
  - a drive electrode, laminated on the first piezoelectric layer, to which a drive signal is supplied externally;
  - a second piezoelectric layer, laminated on the drive electrode and comprised of a second piezoelectric material having a second residual stress lower than the first residual stress; and
  - a second common electrode, laminated on the second piezoelectric layer; and
- a vibration plate, to be deformed by the piezoelectric element;

wherein a portion of the vibration plate deformed by the piezoelectric element constitutes a part of a pressure chamber communicated with a nozzle orifice from which a liquid droplet is ejected.

* * * * *